United States Patent [19]

De Leon et al.

[11] 4,258,009
[45] Mar. 24, 1981

[54] LARGE CRYSTAL FLOAT ZONE APPARATUS

[75] Inventors: Noel De Leon, Frederikssund; Arno I. M. Larsen, Holbaek; Poul E. Knudsen, Randboel; Erik H. Jensen, Hundested, all of Denmark

[73] Assignee: Topsil A/S, Denmark

[21] Appl. No.: 904,103

[22] Filed: May 8, 1978

[30] Foreign Application Priority Data

Aug. 22, 1977 [DK] Denmark .............. 3719/77

[51] Int. Cl.³ .............. C30B 1/08
[52] U.S. Cl. .............. 422/250; 156/DIG. 98; 156/620; 75/65 ZM
[58] Field of Search .............. 422/250, 248, 249; 156/620, 604, DIG. 98, 617; 75/65 ZM; 220/8; 269/137, 266

[56] References Cited

U.S. PATENT DOCUMENTS

| 2,712,394 | 7/1955 | Koschatzky et al. ........ 220/8 |
| 2,876,147 | 3/1959 | Kniepkamp et al. ........ 156/DIG. 98 |
| 3,428,436 | 2/1969 | Tucker .............. 156/DIG. 98 |
| 3,716,345 | 2/1973 | Grabmaier .............. 422/249 |
| 3,771,780 | 11/1973 | Doocey .............. 269/137 |
| 3,897,590 | 7/1975 | Gurs .............. 156/620 |
| 3,961,906 | 6/1976 | Keller .............. 156/DIG. 98 |
| 4,033,569 | 7/1977 | Dunn .............. 269/266 |
| 4,045,181 | 8/1977 | Burd et al. .............. 156/620 |
| 4,078,897 | 3/1978 | Jericho et al. .............. 156/620 |
| 4,116,329 | 9/1978 | Garden .............. 220/8 |

FOREIGN PATENT DOCUMENTS

| 1519901 | 2/1970 | Fed. Rep. of Germany ... 156/DIG. 98 |
| 2706851 | 8/1978 | Fed. Rep. of Germany ... 156/DIG. 98 |
| 2712506 | 9/1978 | Fed. Rep. of Germany ... 156/DIG. 98 |
| 2382266 | 9/1978 | France .............. 156/DIG. 98 |

*Primary Examiner*—Frank W. Lutter
*Assistant Examiner*—Gregory N. Clements
*Attorney, Agent, or Firm*—John A. Fisher

[57] ABSTRACT

Apparatus for the float zone refining of large semiconductor crystals. Additional support in the form of lightweight pins is provided for the growing monocrystalline rod to hold the rod on the proper vertical axis. The pins protrude from the telescoping inner wall portion of the refining enclosure. This telescoping enclosure portion allows the pins to be in synchronous motion with the monocrystalline rod and also reduces the overall height of the apparatus.

6 Claims, 8 Drawing Figures

LARGE CRYSTAL FLOAT ZONE APPARATUS

BACKGROUND

This invention relates to apparatus for the float zone refining of crystalline semiconductor materials, and more particularly to the float zone refining of large semiconductor crystals.

Float zone refining is used to convert polycrystalline material to a high quality monocrystalline rod and, simultaneously, to remove unwanted impurities from the material. In the float zone technique a narrow molten zone is caused to move slowly along the length of a vertically disposed rod of polycrystalline material. This molten zone is unsupported, being held in position only by electromagnetic, gravitational, and surface tension forces. As the molten zone moves, the material immediately behind the zone resolidifies as monocrystalline material. The monocrystalline growth is initially nucleated by a single crystal seed and then continues in a self-seeding manner. Also, as the molten zone moves, it sweeps impurities with it, leaving the material behind the zone in a more pure state.

The molten zone is caused to traverse the length of the polycrystalline rod by moving the rod vertically downward past a stationary heating means such as an rf induction coil surrounding the material. In addition to the translational motion, a rotational motion is also imparted to improve crystal perfection and uniformity.

Consider the situation after a portion of the polycrystalline material has been converted by the float zone process to monocrystalline material. At the bottom of the apparatus a clamp holds a pencil-thin seed crystal. This seed crystal necks out to some larger desired diameter of the converted monocrystalline material and this diameter is approximately maintained along the length of the material. At the top of the apparatus a second clamp holds the upper end of the polycrystalline source material. Separating the unsupported ends of the polycrystalline and monocrystalline material and in contact with each is a zone of molten material. The polycrystalline material can be securely held by the upper clamp, but the converted monocrystalline material is precariously balanced on the thin seed crystal. The upper end of the monocrystalline rod is in contact only with the molten zone.

This method is satisfactory for the zone refining of relatively small crystals, but is clearly unsatisfactory as crystals increase both in length and diameter. Increases in crystal size require that a massive monocryystalline rod and a large volume of molten material, in both translational and rotational motion, be balanced on a thin seed crystal. Any wobble or sideways motion can cause nonuniformities, crystal imperfections, or worse, can cause the molten material to spill if the motion becomes extensive enough to cause the restraining forces of the electromagnetic force and surface tension to be exceeded. Should the latter occur, the crystal would be ruined and the equipment could be damaged.

As the semiconductor industry matures, the demand grows for large quantities of crystals of increasing diameter. Accordingly, a need existed for an improved method and apparatus applicable to the float zone refining of crystals of both increasing length and diameter.

SUMMARY

It is an object of this invention to provide apparatus for the float zone refining of semiconductor crystals. While this invention is particularly applicable to crystals of large diameter and/or length, it can be applied to the zone refining of crystals of any size.

In the prior art, zone refining has been limited to small crystals because of the manner in which the converted crystal was supported; large crystals would be mechanically unstable. Accordingly, the invention herein disclosed provides means for adding additional physical support after a portion of the polycrystalline rod has been converted to the desired monocrystalline rod. Such support is in the form of lightweight pins which can be made to protrude from the walls of the growth enclosure so as to contact the monocrystalline rod, and thereby hold it on the proper vertical axis. Because the rod is in both rotational and translational motion, the support pins must also be in similar motion so that each pin contacts the rod at only one location. To provide the proper motion to the support pins, the growth enclosure has a unique telescoping portion which is in the same relative motion as the crystal rod. Besides being necessary to the support means, the telescoping enclosure allows the total growth enclosure to be of shorter overall height.

The foregoing and related objects and advantages will be further understood from a consideration of the following detailed description taken in connection with the drawings.

DETAILED DESCRIPTION

While the float zone refining apparatus to be specifically described is suitable for the refining of a silicon rod of 75 to 80 mm diameter and a length of about 1 meter, it will be understood that the invention is not to be limited to that one embodiment. Those skilled in the art will appreciate that appropriate modifications can be made to accomodate other materials and other sizes within the spirit and scope of the invention.

Figure 1:
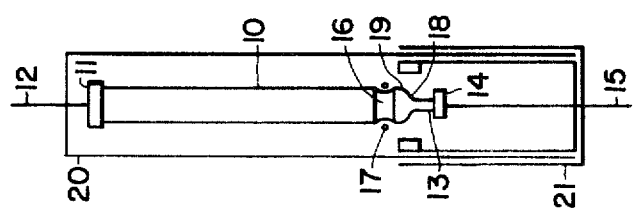

Turning now to the drawings, FIGS. 1-5 show schematically, in cross-sectional view, the steps by which a semiconductor body is refined in the present invention. FIG. 1 shows the apparatus after the refining process has been initiated. A polycrystalline source rod 10 is securely held by a clamp 11 which, in turn, is attached to an upper spindle 12. A single crystal seed 13 is held by a clamp 14 attached to a lower spindle 15. The seed 13 and rod 10 have been brought into contact and a molten zone 16 formed therebetween. The molten zone is formed by heating the junction between the seed and the polycrystalline material by means of an rf induction heater coil surrounding the junction and shown schematically and labelled with the number 17. The molten zone 16 is caused to move along the polycrystalline rod 10 by moving the rod vertically downward past the heater 17. As the molten zone 16 moves along the rod, the material immediately behind the zone refreezes as monocrystalline material. The process is controlled, as well known in the art, to form a necked region 18 which increases in diameter from that of the seed 13 to that desired for the monocrystalline rod 19.

The polycrystalline source 10 is caused to move past the heater 17 by moving the spindles 12 and 15 either independently or in tandem. Likewise, the desired rotational motion can be imparted to the rod 10, molten zone 16, and monocrystal 19 by turning the spindles 12 and 15. The process takes place within a sealed enclosure consisting of a top portion 20 and a bottom portion 21.

Figure 2:
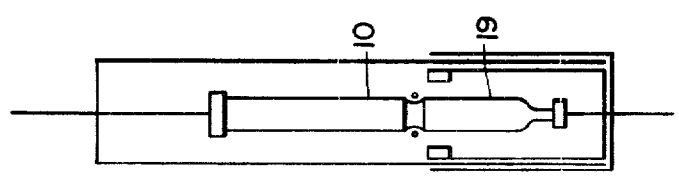

FIG. 2 shows the process continuing. Approximately one third of the polycrystalline rod 10 has been refined and converted to monocrystalline rod 19. The process to this point is similar to prior art processes. If the monocrystal 19 is now approximately 35 cm in length and 75 to 80 mm in diameter, it will have a mass of about 4.5 kgm. A crystal of such physical dimensions is approaching the size limit for prior art processes.

Figure 3:
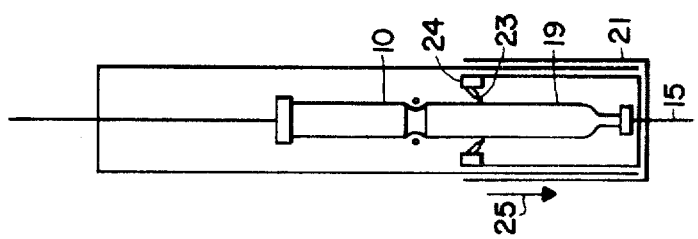

In FIG. 3, approximately one-half of the polycrystalline material 10 has been converted to monocrystalline rod 19. The lower holder 14 has moved to a position near the bottom of the enclosure portion 21. To accommodate the increasing length of monocrystalline rod 19, and to allow the process to continue, the lower enclosure portion 21 is set in motion vertically downward as indicated by arrow 25. The lower spindle 15 and enclosure portion 21 are now moving together in both translational and rotational motion. Until now, the enclosure portion 21 has been rotating synchronously with the spindle 15, but has not been in translational motion.

After the lower enclosure portion 21 has been set into vertical motion, additional support is provided to the growing monocrystalline rod 19 by causing support pins 23 to protrude from the support pin housing 24 which is a part of, and is attached to, the inner wall of the lower enclosure portion 21. It has been found that three such support pins 23 radially spaced at 120° increments about the monocrystal 19 provides adequate support. The support pins 23 lightly but firmly touch the monocrystalline rod 19 and constrain it to rotate on a true vertical axis. The rod 19 is now being supported simultaneously by the support pins 23 and by the seed crystal 13. Each pin must contact the crystal rod 19 at only a single location so as not to cause dislocations or other crystal imperfections. Accordingly, the lower enclosure portion 21, pin housing 24, and support pins 23 are made to move synchronously with rod 19. Because the rod 19 and enclosure 21 are moving together, in both rotational and translational motion, there is no chance that the pins 23 will slip or scrape on the rod either when initially engaged or during the ensuing process.

Figure 4:
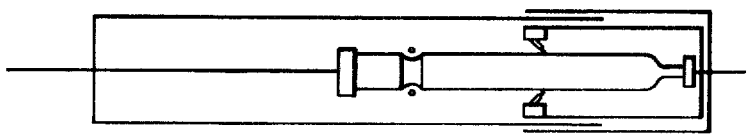

In FIG. 4 the process is shown further continuing. Because of the additional support provided by the pins 23, the refining of a long monocrystal 19 is possible. The polycrystalline material 10 continues to move past the heater coil 17 and, hence, the molten zone 16 progresses upwardly along the polycrystalline material.

Figure 5:
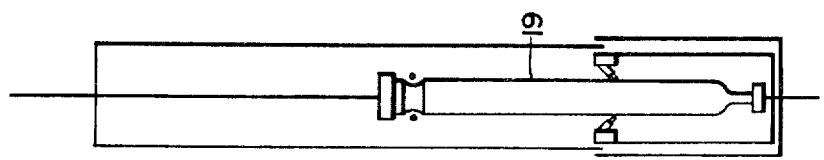
FIGS. 1-5 show schematically, in cross-sectional view, the steps by which a semiconductor body is refined.

In FIG. 5 the refining process is shown to be completed. The entire length of the one meter long polycrystalline semiconductor crystal has been moved past the heater coil 17 and has been converted into monocrystalline rod 19. This conversion has been accomplished by sweeping a molten zone along the length of the polycrystalline rod and allowing the semiconductor material to resolidify as the molten zone passes. The total minimum height required for such an apparatus for refining a rod of one meter length is about 3.5 meters. This contrasts with a minimum height of 4 meters for a conventional apparatus. These numbers represent absolute minimum height requirements; an actual apparatus, of course, will be somewhat greater in height.

Figure 6:
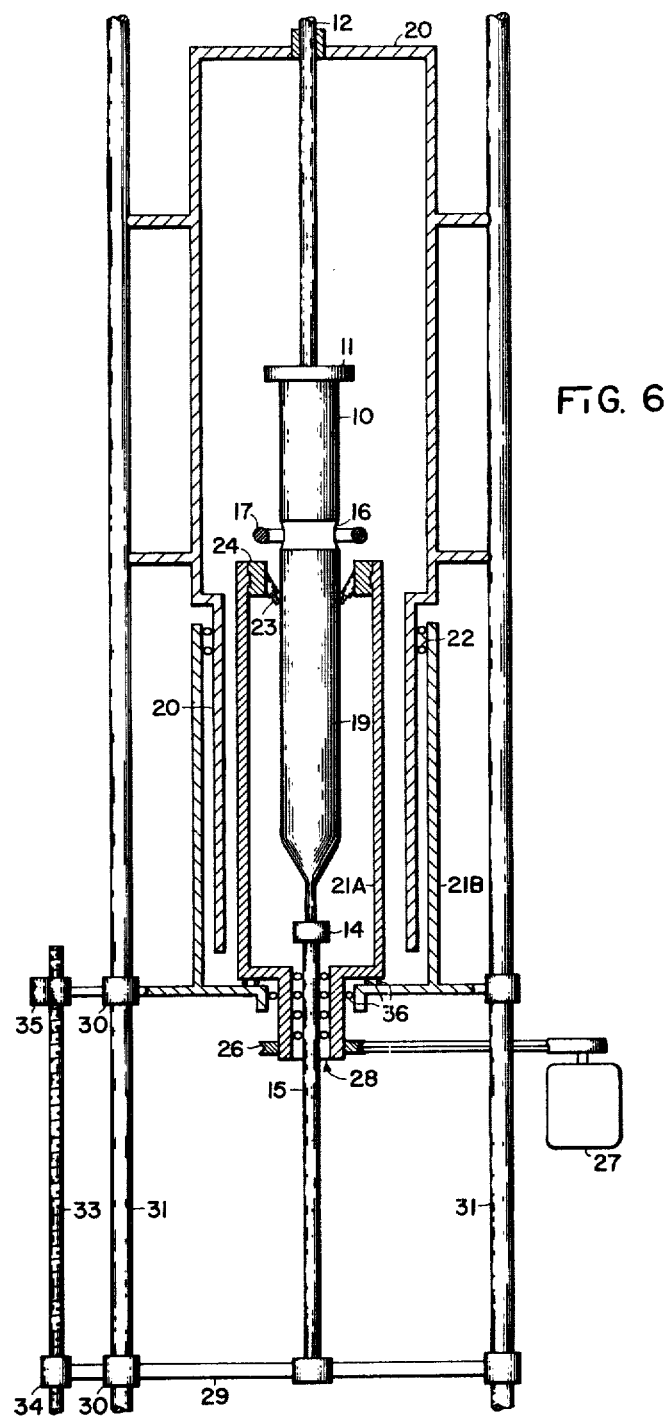
FIG. 6 is a cross-sectional view of the apparatus.
Figure 7:
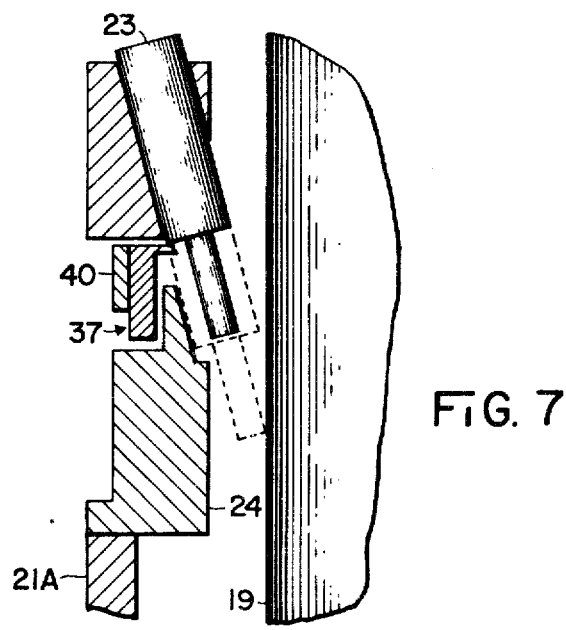
FIG. 7 is a cross-sectional view of the support pin and housing.
Figure 8:
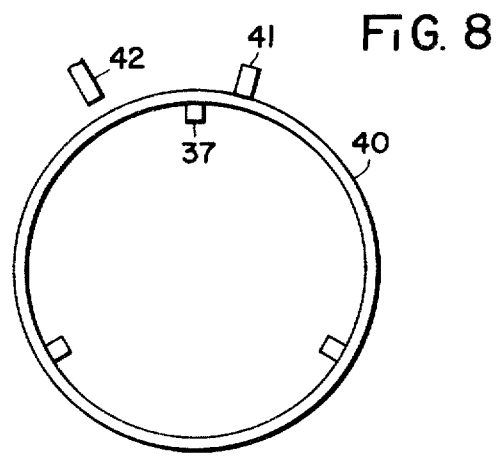
FIG. 8 is a top view of the discharge ring.

FIGS. 6–8 show the apparatus suitable for carrying out the process as outlined above. The unique features of the pin support mechanism and the telescoping lower enclosure portion are shown in detail. The remainder of the apparatus is well known in the prior art and is basically described, for example, in Keck, et al, The Review of Scientific Instruments, Volume 25, No. 4, April, 1954.

In FIG. 6 the apparatus is depicted after the support pins 23 have been made to contact and support the converted monocrystalline rod 19. The pins protrude from the pin housing 24 which is attached to the inner wall 21A of the lower enclosure portion. To maintain each of the pins 23 in contact with a single location on the crystalline rod 19, the pins, pin housing 24, and inner wall 21A are made to rotate synchronously with the rod. This synchronous rotation is accomplished by driving the inner wall 21A by means of a pulley 26 and motor 27. As the inner wall 21A rotates, this motion is transmitted, in turn, to the spindle 15, and thus to the rod 19, by the set of seals 28. These seals serve both to transmit the rotary motion of the enclosure inner wall 21A to the spindle 15 and to form an airtight seal therebetween.

One of the support pins 23 and the support pin housing 24 are shown more clearly in the cross-sectional view of FIG. 7. Each of the pins 23 is inserted in a hole formed in the housing 24. The pin is held in its retracted position, as shown, by resting against the extended lip of a stop 37. The stop 37 is such that it can be made to rotate slightly with respect to the housing 24. When so rotated, the extended lip is moved out of its supportive position and the pin 23 is allowed to drop. In the lowered position, as indicated by the dotted line, the pin 23 rests lightly against the side of the monocrystalline rod 19. The pin 23 must be light in weight to minimize the momentum transfer to the rod 19 when the pin drops into position. The pin must also be made of heat resistant material and must be non-contaminating to the semiconductor material. Accordingly, it has been found that hollow pins made of titanium or stainless steel are satisfactory.

It is important that the three support pins 23 drop into place and contact the monocrystalline rod 19 simultaneously so as not to cause any vertical skew to the rod. Each of the pins is held in its retracted position by resting on a stop 37. The three pins can be made to drop at the same time by simultaneously rotating the three stops. This is done by the discharge ring 40 shown in top view in FIG. 8. The ring, with the three stops 37 located at 120° increments about its periphery, rides in a groove provided in the pin housing 24. The ring 40 rides passively in this groove, rotating with the housing 24 and inner enclosure wall 21A, until needed. The ring is also provided with a finger 41 which protrudes from its outer circumference. After the refining process has proceeded to a point at which the support pins are needed, a braking mechanism 42 is moved into contact with the protruding finger 41. The braking mechanism 42 contacting the finger 41 causes the ring 40 to rotate less rapidly than the pin housing 24. As the ring 40 turns with respect to the housing 24, the stops 37 are rotated out of their supportive positions allowing the pins 23 to drop. The braking mechanism 42 can be mounted, for example, on enclosure portion 20 and can be activated mechanically or electromechanically.

Turning again to FIG. 6, vertical downward translation of the polycrystalline material 10 and monocrystalline rod 19 is accomplished in two steps. First, spindle 15 is pulled downward past the seals 28 at the bottom of the enclosure portion 21A while lower enclosure portion 21 is vertically stationary. As the process continues and the spindle 15 advances so that the holder 14 is brought to a position near the bottom of the lower enclosure portion 21, the enclosure portion 21 is also set in vertical motion and the spindle and enclosure portion move downward together. The vertical motion results from the outer lower enclosure portion 21B and spindle sled 29 riding on bearings 30 which slide on a support frame 31. The enclosure portion 21B and sled 29 can be driven by a single motor which drives a shaft 33 and, in turn, drive gears 34 and 35. A clutch associated with the drive gear 35 allows the enclosure portion 21B at first to be stationary and then, when necessary, to move synchronously with the spindle 15.

As the lower enclosure portion 21 advances vertically downward, an airtight seal is maintained between the upper and lower enclosure portions 20 and 21, respectively, by seals 22. Likewise, an airtight seal is maintained between the rotating inner enclosure portion 21A and outer, nonrotating enclosure portion 21B by the seals 36. Thus sealed, an enclosure has been provided within which the proper ambient can be maintained.

The rest of the apparatus can be of a conventional nature. It includes an upper enclosure portion 20 securely mounted to the support frame 31. A spindle 12 and a clamp 11 which holds the polycrystalline material 10 can be set in both rotational and translational motion using a motor and conventional drive means. An rf generator provides energy for the heater coil 17. Inlet and outlet orifices and a vacuum pump allow the apparatus to first be pumped out and then refilled with the desired ambient gases.

Thus, it is apparent that there has been provided in accordance with the invention, an improved apparatus for the float zone refining of semiconductor materials that fully satisfies the objects as set forth above. While the invention has been described in conjunction with a specific embodiment thereof, it will be understood by those skilled in the art that changes in form and details may be made without departing from the spirit and scope of the invention.

What is claimed is:

1. In an apparatus for the float zone refining of semiconductor materials which comprises a refining enclosure within which a rod of said semiconductor material is held and within which a molten zone traverses the length of said rod of semiconductor material and resolidifies forming a refined portion the improvement which comprises:
   a telescoping lower portion of said enclosure, and
   pins extensible from said lower portion and at an acute angle therewith for supporting the refined portion of said semiconductor rod.

2. The apparatus of claim 1 wherein said pins can be made to protrude from said wall at a prescribed time.

3. The apparatus of claim 1 wherein said pins are hollow and fabricated of titanium.

4. The apparatus of claim 1 wherein at least a part of said telescoping portion is rotating synchronously with said refined portion of said semiconductor rod.

5. The apparatus of claim 5 further comprising means for holding said telescoping portion initially vertically stationary.

6. The apparatus of claim 5 wherein said means for holding said telescoping portion can also be set in vertical motion to enlarge said refining enclosure and to provide vertical motion to said pins.

* * * * *